(12) United States Patent
Vollmer et al.

(10) Patent No.: US 11,132,320 B2
(45) Date of Patent: Sep. 28, 2021

(54) MODULAR PLUG SYSTEM COMPRISING AN INTEGRATED DATA BUS

(71) Applicant: HARTING Electric GmbH & Co. KG, Espelkamp (DE)

(72) Inventors: Christian Vollmer, Herford (DE); Markus Friesen, Espelkamp (DE)

(73) Assignee: HARTING Electric GmbH & Co. KG, Espelkamp (DE)

( * ) Notice: Subject to any disclaimer, the term of this patent is extended or adjusted under 35 U.S.C. 154(b) by 148 days.

(21) Appl. No.: 16/492,506

(22) PCT Filed: Mar. 13, 2018

(86) PCT No.: PCT/DE2018/100225
§ 371 (c)(1),
(2) Date: Sep. 9, 2019

(87) PCT Pub. No.: WO2018/184627
PCT Pub. Date: Oct. 11, 2018

(65) Prior Publication Data
US 2021/0133138 A1    May 6, 2021

(30) Foreign Application Priority Data

Apr. 3, 2017    (DE) ............... 10 2017 003 198.3

(51) Int. Cl.
*G06F 13/38*    (2006.01)
*G06F 13/40*    (2006.01)
*G01R 27/14*    (2006.01)
*G06F 13/24*    (2006.01)
*H01R 13/514*    (2006.01)
*H01R 25/16*    (2006.01)

(52) U.S. Cl.
CPC ......... *G06F 13/4027* (2013.01); *G01R 27/14* (2013.01); *G06F 13/24* (2013.01); *H01R 13/514* (2013.01); *H01R 25/162* (2013.01)

(58) Field of Classification Search
None
See application file for complete search history.

(56) References Cited

U.S. PATENT DOCUMENTS

| | | | |
|---|---|---|---|
| 6,004,162 A | 12/1999 | Harting et al. | |
| 6,004,163 A * | 12/1999 | Behling | H01R 13/514 439/701 |
| 6,206,480 B1 * | 3/2001 | Thompson | G06F 1/1628 200/334 |
| 6,305,950 B1 * | 10/2001 | Doorhy | H01R 24/64 439/76.1 |
| 2003/0194914 A1 | 10/2003 | Duck et al. | |

(Continued)

FOREIGN PATENT DOCUMENTS

DE     29601998 U1    5/1996
DE   202011050643 U1    8/2011

(Continued)

*Primary Examiner* — Hyun Nam
(74) *Attorney, Agent, or Firm* — Smartpat PLC

(57) ABSTRACT

In order to be able to arrange a master module (M), slave modules (S), and conventional plug modules (K) in a freely configurable manner in a modular plug system, a modular frame (22) is provided with a circuit board (1) which includes at least one continuous conductor path and preferably more than one connection pad.

17 Claims, 6 Drawing Sheets

(56) References Cited

U.S. PATENT DOCUMENTS

| | | | |
|---|---|---|---|
| 2004/0092154 A1* | 5/2004 | Doorhy | H01R 13/6473 439/404 |
| 2010/0250805 A1* | 9/2010 | Cohen | G06F 13/4004 710/110 |
| 2011/0217880 A1 | 9/2011 | Schmidt et al. | |
| 2014/0179172 A1 | 6/2014 | Riepe et al. | |
| 2015/0199603 A1 | 7/2015 | Troeger et al. | |
| 2015/0280351 A1 | 10/2015 | Bertsch | |
| 2016/0056567 A1 | 2/2016 | Dugo | |
| 2016/0093980 A1 | 3/2016 | Beischer et al. | |
| 2016/0259747 A1 | 9/2016 | Vandersteegen | |
| 2016/0269194 A1* | 9/2016 | Clark | H04L 12/40013 |
| 2016/0276778 A1 | 9/2016 | Beischer et al. | |
| 2017/0141518 A1* | 5/2017 | Brux | H01R 13/518 |
| 2020/0006886 A1* | 1/2020 | Chen | H01R 13/514 |

FOREIGN PATENT DOCUMENTS

| | | |
|---|---|---|
| DE | 202013103611 U1 | 9/2013 |
| DE | 102012107270 A1 | 2/2014 |
| DE | 102012110907 A1 | 5/2014 |
| DE | 102013106279 A1 | 12/2014 |
| DE | 102015104562 | 9/2016 |
| EP | 1026788 A1 | 8/2000 |
| EP | 1353412 A3 | 10/2003 |
| EP | 0860906 B1 | 5/2004 |
| EP | 2154831 A1 | 2/2010 |
| EP | 2510590 B1 | 4/2014 |
| EP | 2917974 A1 | 9/2015 |
| EP | 2979326 A1 | 2/2016 |
| EP | 2510589 B1 | 8/2016 |
| EP | 3065348 A1 | 9/2016 |
| EP | 3067993 A1 | 9/2016 |
| WO | 2015149757 A2 | 10/2015 |

\* cited by examiner

MODULAR PLUG SYSTEM COMPRISING AN INTEGRATED DATA BUS

TECHNICAL FIELD

The disclosure relates to a modular plug system and to a method for measuring a parameter in at least one slave module of a modular plug system. Modular plug systems of this type are used to adapt a plug, in particular a heavy rectangular plug, flexibly to particular requirements in terms of signal and energy transfer, for example between two electrical devices.

BACKGROUND

Modular plug systems are known in the prior art making use of a modular frame, also known as a retaining frame or module frame, disclosed in numerous printed releases and publications, presented at trade fairs, and are in particular in use in the industrial environment in the form of heavy-duty plugs. They are, for example, described in documents DE 10 2013 106 279 A1, DE 10 2012 110 907 A1, DE 10 2012 107 270 A1, DE 20 2013 103 611 U1, EP 2 510 590 A1, EP 2 510 589 A1, DE 20 2011 050 643 U1, EP 860 906 A2, DE 29 601 998 U1, EP 1 353 412 A2, DE 10 2015 104 562 A1, EP 3 067 993 A1, EP 1 026 788 A1, EP 2 979 326 A1, and EP 2 917 974 A1. As a rule here, a plurality of identical or different plug modules are held together in a modular frame and installed in a plug housing. The function of a plug formed in this way is also very flexible. Pneumatic modules, optical modules, modules for the transfer of electric energy and/or analog and/or digital electric signals can, for example, be used in modular plug systems. Plug modules are increasingly also taking over measurement and data technology tasks.

Document WO 2015/149757 A2 discloses a modular plug system with at least one plug module that has at least one sensor, for example a current sensor. The modular plug system comprises evaluation electronics with control electronics for a bus system. This evaluation electronics can be arranged in a master module of the modular plug system, and is electrically conductively connected via the bus system to the at least one sensor. The plug modules can comprise additional contact means in the form of plug (male) and socket (female) contacts, through which they contact one another. A sequence of a large number of plug modules is possible in this way. A data bus line can thus be looped through an arbitrary number of plug modules, e.g. in the form of a point-to-point connection, through to the master module, wherein the plug modules are, from the electronic point of view, connected in series. The geometric position of the individual plug modules in the modular plug system can in this way be ascertained and communicated to the evaluation electronics by way of a sequential self-configuration of their so-called IDs ("identification number"), e.g. through sequentially "incrementing". The evaluation electronics can thereupon assign the data of the sensors to the associated plug modules.

It is disadvantageous for this prior art that plug modules provided with the said contact means for mutual communication must be directly geometrically adjacent to one another in order to create an uninterrupted data line. There are, however, a large number of standard plug-in modules on the market that do not have such additional contact means. The arrangement of the plug modules in the modular frame is thus restricted in that it may be necessary for all the standard modules to be arranged after one another at the end of the modular frame that is remote from the master module. Furthermore, for the sake of data transfer, those plug modules that have the said contact means must be directly adjacent to one another, i.e. no slot between them can remain empty or occupied by a standard module.

It has been found in practice that this lack of flexibility can sometimes cause serious problems, for example if a specific sequence of plug modules is determined through a particular application, for example through a specified structure of a mating plug. This applies in particular when the mating plug is also such a modular plug system with slave modules whose arrangement is subject to comparable restrictions. The necessity in particular of positioning the master module at one end of the respective modular frame and the conventional plug modules at the other end of the respective modular frame is particularly problematic from this point of view. A further aspect is that fault-finding can, under some circumstances, be made significantly more difficult, since in this way a relatively high effort is required to locate a faulty slave module, or one that is only functioning to a limited extent, out of a large number of slave modules.

SUMMARY

The object of the disclosure is to provide a modular plug system with a data bus that overcomes the above-mentioned problems and which is as freely configurable as possible in terms of the geometric arrangement of its modules, in particular its master and slave modules.

This object is achieved by a modular plug system as claimed.

The modular plug system features the following:
 a. a modular frame for a rectangular plug wherein the modular frame has two long side-pieces lying opposite one another;
 b. a bus system with at least one data bus, comprising at least one conductive track for electronic data transfer extending over at least one of the two long side pieces;
 c. a master module arranged or to be arranged in the modular frame with at least one electrical bus contact for transmitting queries and for receiving responses over the data bus;
 d. a plurality of slave modules arranged or to be arranged in the modular frame each with at least one electrical bus contact for receiving queries from the master module and for transmitting responses to the master module; wherein
 e. the master module and the slave modules are electrically conductively connected to one another with their respective at least one bus contact via the at least one conductive track in the form of a parallel circuit.

The measuring method according to the invention serves to measure a measured parameter in at least one slave module of a modular plug system and to transmit corresponding measurement data from the slave module to a master module of the modular plug system, and comprises the following steps:
 A.) the master module addresses a plurality of slave modules in accordance with the slot position of the respective slave module in a modular frame;
 B.) the master module requests an identifier from each of the slave modules over a data bus;
 C.) the slave modules transmit their respective identifiers over the data bus to the master module;
 D.) the master module recognizes the type of the respective slave module on the basis of its identifier;

E.) the master module loads in each case a software program from an external source that is appropriate for the type of the slave module;

F.) the master module saves the software program in a combined program/data memory;

G.) the master module has the respective software program executed by a microprocessor belonging to the master module, in that it transmits individual instructions to the slave module over the data bus;

G1) the master module has its microprocessor execute at least one software program that causes at least one of the slave modules to measure at least one measured parameter and to make corresponding measurement data available;

H.) the master module requests the measurement data from the respective slave module over the data bus;

I.) the respective slave module transmits the requested measurement data to the master module;

J.) the master module saves the measurement data as belonging to the slave module in the combined program/data memory.

The master module and the slave modules are usually special plug modules which are characterized by their respective properties, e.g. the bus contacts described above under points c. and d. The slave modules typically have corresponding plug-in contacts, e.g. for the transfer of electric energy and/or data to a mating plug, in particular to corresponding modules of a mating plug. Furthermore, the slave modules can have specific sensors, such as current, voltage and/or temperature sensors, for example, to monitor the electric current through the plug contacts and/or for measuring their temperature. The following may be provided as further possible sensors, although this list is not restrictive: a vibration sensor for measuring vibrations, for example in the railway sector; a pressure sensor for measuring pressure, for example in pneumatic modules that are provided, for example, for the transfer of air pressure; light sensors for monitoring optical fiber modules, for example through the measurement of scattered light; and energy modules for measuring electric energy. Some slave modules can, however, also be data processing modules, for example modules that contain a data switch.

The master module can have means for data processing and for control of the data traffic on the data bus, and in particular have a data memory and a microprocessor for this purpose. The data memory can, of course, also serve to hold software programs ready, so that in this case it is, to be precise, a combined program/data memory. For the sake of clarity, however, this combined program/data memory will be referred to as a data memory, since the program commands are, of course, also present in the form of digital data.

Hereinafter, the term "module" can refer to those components of the modular plug system that have a module housing that corresponds in form to the housing of the known plug modules, and can thus be inserted and fastened in mechanically the same form in the modular frame, or also in a comparable modular frame, e.g. of a mating plug. In addition to the known plug modules and to both master and slave modules, energy supply modules and breakout modules can also, for example, be included, wherein the latter are provided to be arranged in the mating plug which will be explained in further detail below.

The data bus named in point b. can be a so-called "master-slave bus", in particular a so-called "I²C bus" (inter-integrated circuit) and/or, for example, a so-called SM bus (system management bus).

A "master-slave bus" refers here to a data bus which, as is known to the expert, has the following working principle: one bus participant is the master, all the others are the slaves. The master is the only one with the right to access the common resource, the data bus in this case, without being asked. The slave cannot access the common resource on its own account; it must wait either until it is asked by the master or, through a connection that bypasses the common resource, indicates to the master that it wants to be asked.

Since the modular frame explained in point a. is an element of a rectangular plug, it advantageously has a form whose cross-section is rectangular, with two long sides and two short sides. The long sides belong to the long side pieces explained in point a. which are in particular essentially flat in implementation, and which, in the assembled state, can be also be aligned essentially in the plugging direction. If the modular frame is, for example, a so-called "hinged frame", the side pieces can also be folded out by means of a hinge to accept the plug modules. After the modules have been inserted into the modular frame, the side pieces are folded together again, in order to hold the modules between them, in particular making use of latching means.

For the final friction-locking of the modules in the hinged frame, the side pieces are again fixed, aligned in the plugging direction, and thus parallel to one another, for example through screwing the hinged frame to a surface in, for example, an inner flange of a plug housing. The plug modules can in this way be fixed in the modular frame at least with friction lock and, in particular, also at least in some regions with positive lock, and advantageously with a particularly high holding force between the side pieces.

In another construction, the side pieces of a modular frame can comprise sprung regions, e.g. elastic cheeks, which in particular have brackets, preferably with latching means, wherein these sprung regions are suitable for fixing the modules in the modular frame. The plug modules can then easily and advantageously also be pushed into the modular frame and latched there from the cable connection direction and in the plugging direction. This construction has the primary advantage that the modules can be plugged in and removed individually without interfering with the fastening of the other modules.

In particular, the slave modules can be connected to the master module over the data bus through a star-point data transfer structure, wherein the master module constitutes the star point.

The master and the slave modules can advantageously electrically contact the at least one conductive track of the data bus described under point b. with their respective electrical bus contacts for mutual, bidirectional data exchange, and are thus connected in parallel with one another from the electronic point of view. The bus contacts of the respective slave module are then connected electrically conductively and directly via the data bus to the bus contacts of the master module. From the point of view of data technology, an important precondition is thus satisfied for connecting the master module to the slave module in a star-point configuration, since as a result each slave module has the possibility of communicating directly with the master module, that is to say, without having to pass indirectly through other slave modules.

The star-point data transfer structure can on the one hand be achieved in that the master module itself actively transmits data via the data bus to one of the slave modules, e.g. in that it sends a query to one of the slave modules at a specific point in time. On the other hand, the master module makes sure that only at most one single slave module, in this case the one that was queried, responds to it at any point in time. By means of a transmission protocol stored in the data memory of the master module and by means of a microprocessor belonging to the master module, the master module employs an appropriate bus protocol, in particular a "master-slave bus protocol", e.g. the I²C bus protocol, and thus ensures that only one slave module ever communicates directly with the master module, while the other slave modules remain silent. In particular, each slave module responds exclusively to queries from the master module.

The master module further concludes its query to each slave module recognizably in terms of data technology, and waits with its next query until the slave module has fully responded. The respective module of course does not respond until after the master module has recognizably concluded its query. In this way, it is ensured that at any one point in time, never more than one participant is talking on the data bus, and each slave module exclusively communicates directly with the master module.

As a result of this temporal separation of the messages on the data bus, a single conductive track is theoretically sufficient for the actual data transfer, which represents a highly advantageous variant due to the low space requirement for this application. On the other hand, it has been found in practice that for the robustness and flexibility of the data transfer, it is extremely advantageous if the data bus has at least two conductive tracks, wherein the first of these two conductive tracks is provided for the said data transmission and the second conductive track for clocking.

This form of clocking makes it possible that, for example, a slave that for example requires more time for internal processes, e.g. measurement processes, can temporarily lower the clock rate with a so-called "clock stretching", in order to slow down the master module, and thereby the process flow, without at the same time threatening the fundamental principle of the master-slave-based data bus structure.

The modular plug system can in addition have at least two further conductive tracks for supplying power to the slave modules. A first of these two further conductive tracks can then continuously supply current, e.g. supply direct current, and can thus serve for the supply of electrical power to the slave modules and/or the master module. The supply voltage of this energy supply can, for example, be between 1 V and 6 V, preferably between 2 V and 4.5 V, and in particular 3.3 V.

The second further conductive track can be a ground line for connecting ground to the slave modules and/or the master module, so that the supply voltage thereby has an associated ground potential. This ground potential can also be used as a reference potential for other electronic circuits, and thus, for example, also act as the reference potential for the electrical data transfer.

Furthermore, at least one additional conductive track can, be provided, e.g. according to the MS bus standard, as a so-called "interrupt line", to make it possible, for example, for each slave module to inform the master module actively as quickly as possible of the presence of a fault state, for example the occurrence of a short-term overvoltage and/or a very high short-term current and/or a particularly high temperature etc. at at least one of its plug contacts. The fault state can thus be communicated to the master module as a so-called alarm (or "alert") function wherein any kind of electric signal, e.g. an electric pulse) on the interrupt bus is sufficient to trigger an interrupt in the master. Which slave module transmits this pulse is irrelevant here, as is the possibility that a plurality of slave modules simultaneously, or nearly simultaneously, transmit this pulse. The software program being executed at that time by the master module is then interrupted as quickly as possible at its current location, and immediately jumps, as a result of the interrupt alarm, into a so-called "interrupt service routine" provided for the purpose. In the present case, this is executed in such a way that the master module uses the data line to cause each of the slave modules to read out an associated, so-called "interrupt service register", in order to find out which slave module triggered the interrupt alarm and has triggered this interrupt (e.g. overvoltage at the contact of the relevant slave module). Previously, when the interrupt was triggered, e.g. by the sensor of the module, the interrupt service register was supplied with appropriate information about the cause of the interrupt. The identification of the module, on the other hand, can in particular emerge from the position of the module in the modular frame, and be assigned by the master module through an electronic addressing, as is indicated below by way of example.

A further contact region, in particular a further contact pad, which is referred to below, in accordance with its function, as a resistor contact pad, can be provided in the bus system for identifying the geometric position of the respective slave module in the modular frame. An electrical resistor is arranged for this purpose at each module slot and connected between the resistor contact pad and the further conductive track that carries the ground potential. In particular, the electrical resistor, e.g. a commercially standard carbon or metal film resistor, can be electrically conductively connected, e.g. soldered, with its first terminal to the resistor contact pad and with its second terminal to the conductive ground track. The magnitudes of the electrical resistors of the different module slots differ significantly from one another, in order in that way to enable an electronic identification of the insertion position of the respective slave module. In particular, under laboratory conditions, the electrical resistors are ohmic resistors whose magnitudes differ measurably from one another.

The magnitude of the respective electrical resistor is thus chosen according to position. This has the purpose of identifying the position in the modular frame in an electronically readable manner. Each slave module can thus apply a predetermined electric voltage to the respective contact region, in particular at the respective contact pad, and measure a corresponding current and, for example, transmit its magnitude to the master module in response to a corresponding query, so that the master module can ascertain the position of the respective slave module through the magnitude of the current, i.e. indirectly of the respective ohmic resistance. The first module slot can, for example, have an ohmic resistance of $R1=100\ \Omega$, the second module slot an ohmic resistance of $R2=200\ \Omega$, the third an ohmic resistance of $R_3=400\ \Omega$, etc.

When a predefined electric voltage of, for example, 1 V is applied at the first module slot of a first slave module, a first current of $I_1=0.01$ A is measured. This value can be digitized by the first slave module and queried by the master module. The master module can thereupon, for example by means of a table stored in the data memory of the master module, assign a specific identification number (ID), e.g. in this case ID 1, corresponding to the first module slot, to this slave module on the basis of the current, i.e. on the basis of the electrical resistance and thus on the basis of its geometric position.

A further slave module can then be located in, for example, the second module slot. This further slave module would then measure a second current of $I_2=0.005$ A, transmit this value on request to the master module and in the same way receive 2 as the ID.

As an alternative to this, however, the second module slot can also remain empty, i.e. not initially be occupied by a slave module. The further slave module could, instead, be inserted into some other module slot, for example in the third module slot of the modular frame. In this case, it would in the same way receive the identification number, for example 3 as the ID, belonging to the third module slot.

Similar considerations then of course apply to the further slave modules, i.e. they measure the value of the electrical resistor i.e. of the electric current with a known applied voltage, at their respective module slot, and transmit a value signifying that to the master module. The master module, using the table it has stored in the data memory, associates the number of the module slot with the respective electrical resistor, and this simultaneously serves as the basis for the ID of the respective slave module.

This is particularly advantageous, since in this way the slave modules can be distributed almost arbitrarily within the modular frame. They therefore do not have to be immediately geometrically adjacent. One or a plurality of module slots can thus, for example, remain at least temporarily unoccupied between the slave modules, or standard (i.e. conventional) modules which, amongst other things, are characterized in that they do not have bus contacts, can be arranged between the slave modules. The said addressing can, nevertheless, be performed automatically, depending on the geometric position of the respective module, and thus provide information about the geometric position of the respective slave module.

This is particularly advantageous if a corresponding modular plug system exists both in one plug as well as in its mating plug. In practice, after all, slave modules and standard (conventional) modules of the plug and the mating plug are most often located opposite one another and are plugged together. In practice, it is consequently scarcely possible in every modular frame to arrange the standard (conventional) modules at one end, the master module at the other end and the slave modules in between and immediately adjacent to one another and adjacent to the master module, which corresponds to the restrictions of the prior art.

In this way, it is furthermore advantageously possible for modules to be subsequently removed from a modular plug system that has once been occupied, and or to be extended, without changing the configuration of the modules remaining in the modular frame. The original distribution of the IDs remains the same for them, and is, furthermore, reproducible, so that in the case, for example, of a new distribution, if on some occasion this is necessary for software reasons, they would automatically again accord with the original distribution, provided each of these modules remains at the same module slot.

In one advantageous embodiment, the master module has evaluation electronics with control electronics for regulating the data transmission on the data bus in order thereby to recognize the plug modules held in the modular plug system, to assign their identification number to the respective geometric position in the modular frame and, furthermore, to assign measured values from the sensors arranged in the plug modules to the respective plug module and process them accordingly.

The direct and easy mapping through data technology of the module slots through the respective identification numbers (IDs) also has particular advantages for the capacity of the modular plug system to operate in networks.

In particular, the master module possesses an external network interface for this purpose, in order thus to forward at least some of the measured values and/or parameters calculated from them in the form of measurement data to an external network.

Furthermore, a respective individual software of the slave module can be stored in the data memory of the master module. Measurement processes and/or a communication behavior of the slave module can, for example, be controlled with this software. The software can, however, alternatively or in addition, also relate to the network capability of the slave module with regard to the external network, as explained in more detail below.

The individual software of the slave modules, which is in particular at least partially present in the form of so-called "software containers", can be loaded, for example via the network interface of the master module, into the data memory as soon as the corresponding slave module is inserted into the modular frame and recognized by the master module. It is advantageous for this purpose if the modules have an identifier from which it is possible to see the type of the respective module and which software the master module should load. The slave module can, for example, be a current, voltage or temperature measuring module, to each of which a different software belongs. It can, however, also be a data technology module which, for example, contains a so-called data switch, meaning that the software of this type of module varies markedly from the type of a current measuring module, the type of a voltage measuring module or the type of a temperature measuring module.

The master module can request this identifier from the respective slave modules and store it in its data memory, for example in its said table, together with the respective ID, as belonging to the respective module. Furthermore, this individual software can also be deleted from the data memory of the master module as soon as the corresponding slave module is removed from the modular frame. This principle permits any desired number of reconfigurations of the modular plug system, meaning that any desired number of slave modules can be removed from and added to the modular plug system without the storage requirement of the data memory rising as a result and/or an appropriately dimensioned storage capacity of the data memory ever consequently being exceeded, since the unnecessary software is automatically deleted and the required software then automatically loaded.

In one preferred embodiment, the software of two modules of the same type can be stored only once in the data memory in order to save memory space. The individual data of each module must then, of course, nevertheless be stored separately.

In addition to the said associated ID, the master module can, for the sake of its network capability in the external network, assign a further virtual identification number for the external network to each slave module, so that the slave module can thus additionally be addressed by the external network. The master module can assign this virtual ID in the said table of the ID of the module and/or store it together with the individual software of each module in its data memory. From the point of view of the network, it then appears that the respective slave module is addressable and can be communicated with directly, though in fact in the form of a virtual network participant, meaning that the external network appears to communicate directly with the virtual slave module, namely with the software of the respective slave module through its virtual ID. The external network can in this way directly exchange data, e.g. measurement data, with the slave module and/or control processes, e.g. measurement processes, of the slave module, even though this data exchange, considered physically, initially only takes place between the external network and the master module. In other words, the master module can map the slave module it manages to the external network so that the network can access the slave module without any changes or additional information.

A principle of this sort can advantageously be handled particularly easily due to the particularly clear structure of the assignment of the IDs and their geometric association with the module slots in the modular frame. In particular, the fact that no restructuring takes place in respect of slave modules remaining in the modular frame even when other slave modules are removed is of great advantage both for the clarity of the programming as well as for the operational reliability of the modular plug system and for the manual operability. The relationship between manufacturing costs and the quality of the modular plug system can be significantly improved in this way.

In one advantageous embodiment, the modular plug system can have a bus system with a total of five continuous conductive tracks, namely the two said conductive tracks for the data bus (data, clock), the two further conductive tracks for the power supply (supply voltage, ground potential) as well as the said additional conductive track as an interrupt line.

Depending on the particular application or on particular electronic schemes, a different number of conductive tracks can, however, be provided to implement the described bus concept in other forms of embodiment. On the one hand, the number of continuous conductive tracks is due to the respective power supply and ground supply concepts, and on the other hand to the respective data bus concepts. "Continuous conductive tracks" here refers to conductive tracks that are able to connect the slave modules arranged in the modular frame electrically conductively to the master module, i.e. the master module and each of the slave modules held in the modular frame contact the continuous conductive track electrically with their bus contacts.

The conductive tracks of the bus system can, in some circumstances, be integrated into at least one printed circuit board. The circuit board can preferably be arranged with positive lock in a recess in the side piece of the modular frame, and in particular be fastened to it by gluing. The circuit board can be attached in one or in both the long side pieces of the modular frame in such a way that its front side faces the interior of the modular frame. Alternatively or in addition, all or some of the conductive tracks can also be integrated in the so-called "MID" (molded interconnection device) technology in the modular frame, in particular when the modular frame is a plastic holding frame. The conductive tracks can each comprise at least one contacting surface and/or at least one contacting region on the inward-facing front side for contacting each bus contact of both each slave module as well as of the master module.

The conductive tracks advantageously extend in the longitudinal direction, essentially over the entire side piece. Some of the conductive tracks can, for example, run on the front side of the circuit board, and others on the rear side. Conductive tracks can also run inside the circuit board in the case of multi-layered circuit boards. Furthermore, some or all of the conductive tracks can run in some segments on the front side of the circuit board and/or in some segments on the rear side of the circuit board and/or in some segments in the interior of a multilayer circuit board. A circuit board can, for example, be interrupted on the front side but be bridged however by a conductive track segment of the rear side, i.e. the circuit track parts arranged on the front side are electrically conductively connected together by their rear-side bridge, so that the conductive track as a whole can be considered as continuous. Alternatively or in addition, a plurality of contact pads on the front side, for example two, can be connected to one another by a short conductive track on the rear side in the form of a bridge. In this way, one or a plurality of contact regions, in particular contact pads, can be arranged on the circuit board next to one another in the longitudinal direction for each slave module. A plurality of contact regions, in particular contact pads, offset in the longitudinal direction can thus be made available to each slave module, which greatly simplifies the design of the modules, in particular the arrangement of the bus contacts at the module housing. In particular, a plurality of contact pads for the same function can in this way be made available in a particularly geometrically suitable manner for flexible contacting through different and/or differently oriented modules, in particular in that they are bridged on the rear side of the circuit board, i.e. electrically conductively connected to one another through a comparatively short conductive track.

It is in most cases sufficient for the master and slave module to be inserted into their respective retaining frame with the same orientation. If two modular frames are occupied in this way, then one can be used for a plug and the other for the associated mating plug.

When the plug and mating plug are put together as intended, then the plug faces of the slave and of the module plug are automatically aligned to one another, and can thus be plugged together, provided their plug faces match one another, e.g. in that they are, for example, of male and female design and satisfy the same plug standards and, if relevant, are encoded to match one another etc. As already explained, the term "module" can refer to master and/or slave modules or also, for example, to the energy and breakout modules described below, which have some special features in this respect.

It can, namely, be particularly advantageous for specific applications if the modules of the plug and the modules of the mating plug point in the same direction when the plug and the mating plug are plugged together. For this purpose, at least some modules in one or both modular frames must be arranged with a reverse orientation.

Such a reverse orientation of two modules that are to be plugged together can, for example, be useful between the master module of the plug and the energy supply module of the mating plug. Such an energy supply module serves, for example, for the temporary storage of electric energy, for example for the temporal bridging of a period of time in which the modular plug system does not have a wired energy supply.

A further application of reverse orientation of two modules that are to be plugged together can relate to the master module of the plug and a breakout module of the mating plug. A typical application of such a combination of master module and breakout module would be that both the plug and the mating plug comprise a modular plug system. Each of these two modular plug systems can then, of course, have its own master module. This is, however, highly uneconomical in comparison. A preferred embodiment therefore provides that only the plug has the master module. In the mating plug, on the other hand, the breakout module that can be plugged into the master module is provided, said breakout module being suitable to interact with the master module of the plug and, considering the two together, to form a common master module for both modular plug systems, and in this way to combine them into a common modular plug system. For this purpose, the master module and the breakout module can be arranged at mutually corresponding slots of the respective retaining frame of the plug and of the mating plug, so that when the plug and the mating plug are plugged together, they can be connected for the purposes of data technology, in particular via a common USB interface.

Furthermore, the breakout module has bus contacts for electrically contacting the bus system of the mating plug. In a preferred embodiment, the breakout module can prepare the received data and transmit it to the master module via a common interface. The master module can then receive the signals in the form of a further data bus, in particular by means of its microprocessor, and process them with the microprocessor and a further bus protocol stored in the data memory. The identification numbers of the modules of the mating plug can here be appropriately identified and/or changed in order to distinguish them, in particular individually, from the modules of the plug and/or to identify them as a group as belonging to the mating plug. As an alternative to this, the breakout module can also simply carry over the lines of the bus system of the mating plug to the master module. The master module can then electrically conductively connect these to the bus system of the plug, so that the bus system of the plug is simply extended by the bus system of the mating plug. The master module operates as described above, and thus merely has a larger number of slave modules to manage, namely with the addition of the slave modules of the mating plug. For this purpose, the slave modules can either be appropriately arranged in the retaining frame—each slave module is plugged together with a standard module in one advantageous concept—and/or the resistors are appropriately arranged and/or chosen at the respective retaining frame and/or the breakout module modifies the corresponding information relating to the identification number and, in particular, the geometric arrangement of the modules. The master module can in this way advantageously distinguish the modules of the mating plug from those of the plug individually and, preferably, also as a group.

As in the case of the insertion of a new slave module already described, the master module can thus recognize the slave modules of the mating plug when plugged together with the breakout module, and, if required, request the associated software needed in each case, e.g. via the external network, and place it in its data memory. In this way, the master module can manage the slave modules of the mating plug in addition to the slave modules of the plug.

The advantages of the free configurability associated with the disclosure can be seen particularly clearly when the breakout module is used. Under the prior art, namely, all the slave modules in both the plug and in the mating plug must be arranged in the region of the master and breakout modules, which has no recognizable technical value for the majority of applications. As a rule, after all, it makes little sense to connect two current measuring modules together. In contrast, a typical application consists of connecting a current measuring module to a standard (conventional) module. This standard module must, however, for this purpose also be located at the corresponding module slot in the modular frame which, for the reasons mentioned above, would at least be problematic under the prior art whereas, according to the disclosure in the said freely configurable form, it can be done without difficulty.

For reasons of consistency and of manufacturing costs, it is particularly advantageous for as many modules as possible, but in particular for the master and breakout module as well as for the energy module and/or for the slave modules, to use housings of essentially the same structural form. The term "essentially" means here that, for example, the bus contacts in some structural forms are implemented in such a way that the modules can be arranged in the modular frame with the reverse orientation in terms of their insertion direction, and in this inverted orientation are able to contact its bus system electrically for this purpose.

In particular, each module housing has two latching lugs that are arranged at two mutually opposing end faces of the essentially rectangular module housing. The modules can thus be latched into corresponding latching windows of the side pieces of the modular frame. The two latching lugs, which are preferably rectangular in cross-section, differ from one another in particular in their shape, in particular in their size, for example their respective length. Through these two different latching lugs and the associated latching window of the two mutually opposing side pieces, the orientation of the modules in the modular frame is predetermined in terms of a rotation about their longitudinal axis.

As described above, it is however advantageous to insert some modules, e.g. energy and breakout modules, with the reverse orientation in terms of the insertion direction in their respective modular frame, in this case in the modular frame of the mating plug. These modules are referred to below as reverse-oriented modules. They differ from the other modules essentially in the position of their bus contacts on the otherwise identical module housing, in order to be able to contact the bus system in the reverse orientation.

To simplify the formulations, the cable connection side of a plug module, of the corresponding module housing and of the modular frame are deemed below to be on top, and the opposing respective plug side as underneath.

The bus system is then advantageously arranged at the side pieces of the modular frame underneath (plug-side) the latching window.

The bus contacts at the module housing arranged therein are accordingly also located underneath their latching lugs. With reverse-oriented modules on the other hand, the bus contacts must be located above the matching lugs in order, when in the installed state, to be able to contact the bus system of the retaining frame of the mating plug.

In accordance with the above considerations relating to the bus system, each slave module can in particular comprise six bus contacts, namely two for the two data lines, two for the power supply, one for the interrupt line and another for contacting the resistor pads. The slave modules are comparable in terms of the internal electronics of these bus contacts, which is largely identical for the different slave modules as well as for the reverse-oriented modules, and is, for cost reasons, prefabricated from standard parts as far as possible collectively, on circuit carrier components that are implemented, for example, in the form of circuit boards.

In order that important basic elements of the electronics, in particular the circuit carrier, can be adopted in the most similar possible form also for the manufacture of the reverse-oriented modules, it has been found in practice to be particularly advantageous if the bus contacts can be arranged in the horizontal direction as far as possible on the same side of the module housing. The positions of the contact pads of the bus system for the reverse-oriented modules must consequently be arranged offset in the horizontal direction. This conflicts with the need to be able to arrange all the modules flexibly at any desired location in the modular frame, and to be able to use the same modular frame for the plug and the mating plug.

In order to be able to always use this same arrangement of conductive tracks and contact pads at the modular frames and, in particular, on the circuit boards, it is therefore particularly advantageous to provide a plurality of contact pads for the same function in the bus system. There can, for example, be two contact pads that establish a connection to the ground line for each module slot. In the same way, it is possible, when relevant, for a plurality, for example two, resistor contact pads to be arranged at each module slot of which, depending on the orientation, optionally only one is contacted by the corresponding bus contact of the respective module. These two resistor contact pads can, for example, be bridged on the rear or in an inner layer of the circuit board, i.e. electrically conductively connected together, and connected to the ground line together via the corresponding electrical resistor. In one particularly advantageous embodiment, a single modular frame can in this way be suitable for contacting modules of both orientations.

In a further possible embodiment, a complete or partial bus system can be provided at each of the two longitudinal sides of a modular frame, and the respective module can also comprise corresponding bus contacts at two mutually opposed end faces. Then, for example, one or the other of the bus systems, or even both bus systems, can optionally be used. While this solution is particularly convenient, it is however comparatively expensive and therefore deemed somewhat uneconomical.

In summary and/or in addition, the disclosed modular plug system has the following advantages over the prior art:

The physical position of the modules, in particular of the slave modules, corresponds to their ID. Faulty modules can be easily localized in this way and thus exchanged, for example automatically, for example by a robot. Through the possibility, described above, for the automatic self-configuration of the IDs and of the software of the modular plug system, an automatic population of the modular frame with modules, e.g. slave modules, and/or an automatic repair of defective and/or adapting to changed requirements is enabled. The fault-searching for modules that are defective or only capable of limited function is considerably simplified by the star-point bus structure. Moreover, the search for the cause of the fault is made easier in particular through the capacity of the slave modules to operate in a virtual network.

The invention furthermore allows faults, in particular transmission and/or electronic contact faults of the data bus system with the following causes, to be reduced or even avoided entirely: modules, i.e. plug modules, slave modules, master modules etc. that are arranged in modular frames typically have a degree of so-called "play", i.e. they are often held in the modular frame with a certain mechanical tolerance. This is usually viewed as desirable, since, at least in the case of the plug modules, it acts to compensate corresponding tolerances with respect to the mating plug during the plugging process. In relation to the contacting of the master and slave modules with the common data bus system, however, these tolerances are problematic. In a system such as one that corresponds to the prior art, this finally leads to a large number of possible contact faults connected in series, each of which disconnects from the data bus the slave modules lying behind it as seen by the master module.

The solution according to the disclosure, in contrast, has two important advantages: on the one hand, as a result of the parallel interconnection of the master and slave modules, only the slave module at which this fault occurs is affected by a particular contact fault. On the other hand, such faults do not occur, or only do so very rarely, since the connecting pads have a sufficient size to compensate for such mechanical tolerances. The connecting pads can be components of the circuit board or of the said MID coating of a plastic frame and are, as already described, electrically conductively connected to the data bus system with the electrical conductive tracks. In operation, they are contacted directly by the bus contacts of the master and/or slave modules arranged in the modular frame. Within a defined region, which is defined by the size of the connecting pads, these modules can therefore move in the modular frame, while their bus contacts at the same time maintain the electrical contact with the connecting pads.

A further advantage is that the bus system is backward-compatible, meaning that standard plug modules can also be used at arbitrary slot positions in the modular frame without interrupting the data traffic. The modular plug system can thus be freely adapted to any arbitrary and/or arbitrarily occupied mating plugs. In particular, both the plug as well as its mating plug can have a modular plug system with slave modules without thereby giving rise to problems relating to their arrangement in the respective modular frame.

Modules provided for this purpose can also be inserted into the modular frame with the reverse orientation and connected to the bus system. The use, for example, of the breakout module or other extension modules, such as for example the energy module, in the mating plug together with the master module of the plug can thereby be enabled. Through a breakout module such as is described above, the master module can in particular also manage the slave modules of the mating plug.

It is provided in a further advantageous embodiment that a particularly non-volatile data memory is arranged in each slave module. A table is placed in this data memory through which the value of the electrical resistor is assigned to the respective associated slot in the modular frame. Each slave module can thereby itself know its own position in the modular frame. In particular, the slave module can itself assign the corresponding ID and preferably communicate it to the master module in response to a corresponding query. In this way, the addressing described under method step A.) can take place according to this advantageous embodiment alternatively or in addition to the variant described above.

BRIEF DESCRIPTION OF THE DRAWINGS

An exemplary embodiment of the invention is shown in the drawings and is explained in more detail below.

DETAILED DESCRIPTION

The figures contain illustrations that are in part simplified or schematic. In some cases identical reference signs have been used for elements that are equivalent but not in all cases identical. Different views of the same elements can be scaled differently.

Figure 1A:
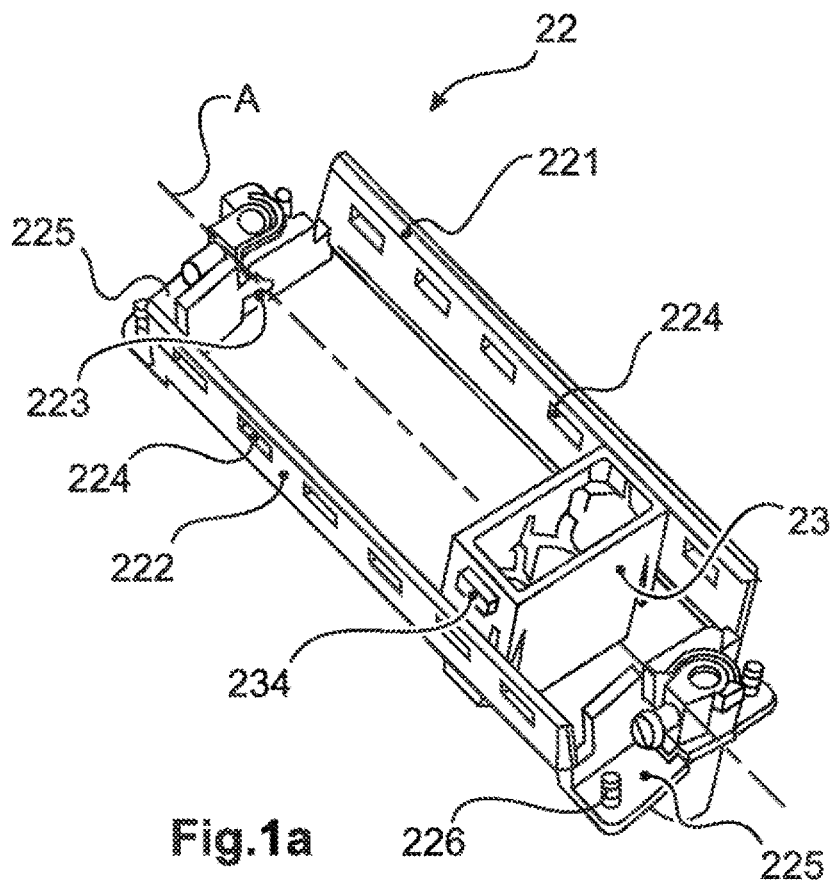
FIGS. 1a, b show a form of embodiment of a corresponding modular plug system of the prior art.
Figure 1B:
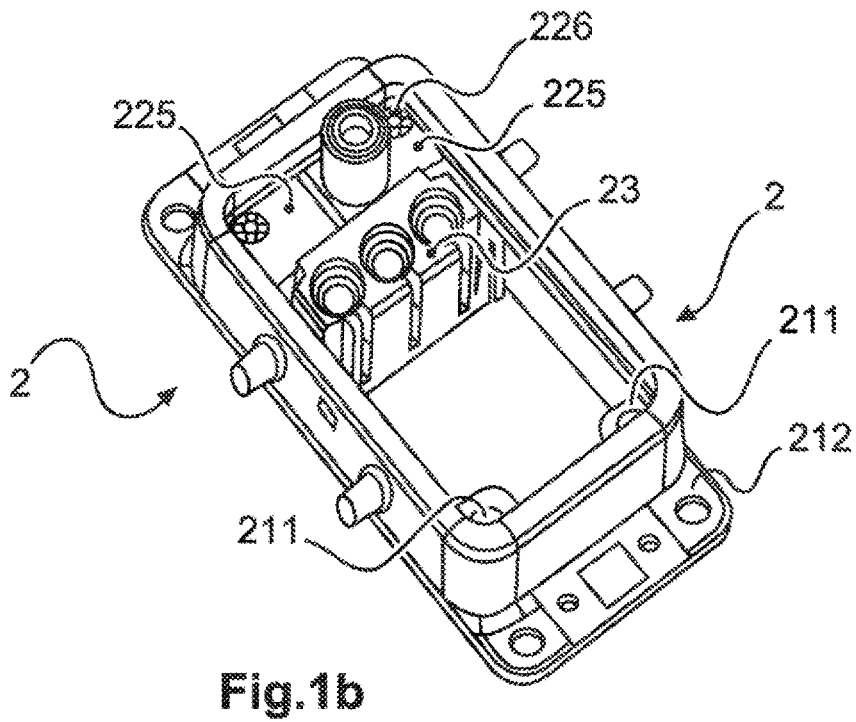

For the sake of completeness, a corresponding modular plug system corresponding to the prior art is shown in FIGS. 1a and 1b, which has, by way of example, a modular frame that is implemented as hinged frame 22, as is known in the prior art inter alia from the above-referenced patent application EP 0 860 906 A2.

The plug 2 thus comprises a plug housing 21 and the said hinged frame 22.

The hinged frame 22 is suitable for installation in the plug housing 21 or for fastening via a breakthrough to a fastening surface/mounting wall after the insertion of modules which in the prior art are typically conventional plug modules 23.

The hinged frame 22 consists of two frame halves connected by hinges 223 with fastening ends 225 that are provided with fastening screws 226. The hinges 223 are provided here at the fastening ends 225 of the hinged frame 22, while the pivoting capacity of the frame halves is provided transversely to the side pieces 221, 222 of the hinged frame 22.

To form the hinges 223, formations similar to puzzle pieces which engage in corresponding recesses are provided at the fastening ends 225 of the hinged frame 22. These formations are here pushed into the recesses through a sideways shift of the side pieces, after which the side pieces are pivotable (can turn) around the longitudinal axis A.

Windows 224 are provided in the side pieces 221, 222 of the frame halves into which the latching lugs 234 of the respective modules 23 plunge as they are inserted into the hinged frame 22.

The retaining frame 2 is folded out, i.e. opened, for insertion of the plug modules 2, while the frame halves 221, 222 are folded out about the hinges 223 sufficiently far that the modules 23 can be inserted.

For fixing, the frame halves are folded together, and the two side pieces 221, 222 are thus aligned parallel to one another, i.e. the hinged frame 22 is closed; the respective latching lugs 234 of the plug modules 23 reach into the windows 224, and are held securely with positive lock of the module 23 in the hinged frame 22.

Figure 2A:
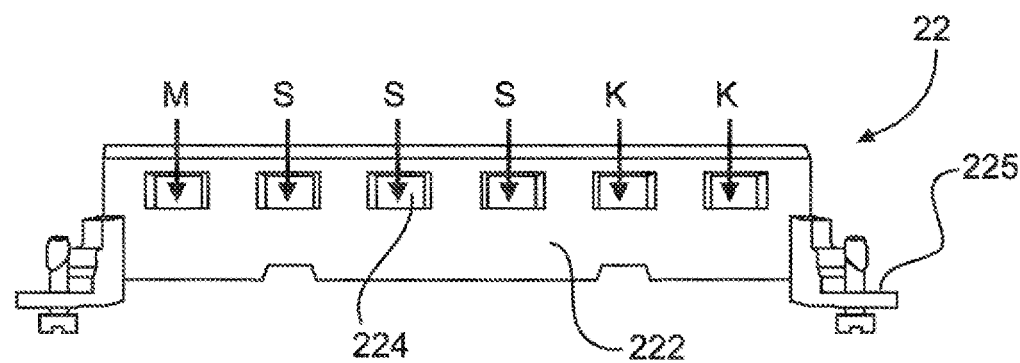
FIG. 2a shows a schematic illustration of an arrangement of modules in a modular frame known from the prior art.
Figure 2B:
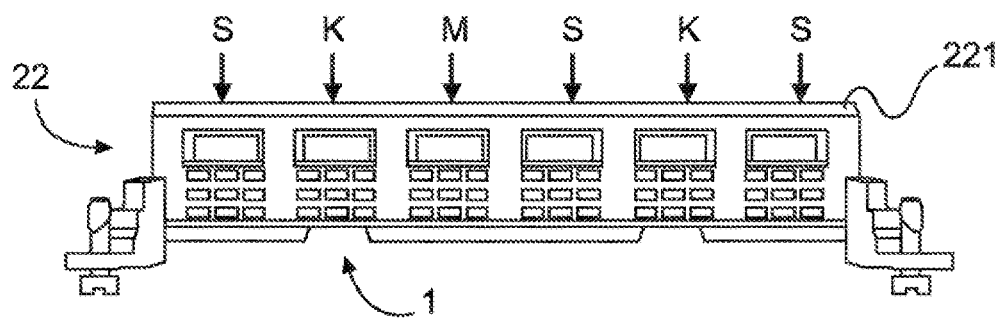
FIG. 2b shows a schematic illustration of an arrangement of modules in a modular frame.

Such a modular frame 22, employed in a plug housing 21, is finally shown in FIG. 2b. A cutaway view of the modular frame 22 has been chosen here in order to be able to recognize the details better. The closed position of the hinged frame 22 is finally fixed by screwing the modular frame 22 to the fastening eyes 221 lying in a fastening plane in the housing corners.

This implementation of this modular plug system and of the corresponding modular frame is explained by way of example. In further embodiments, the use of modular frames of different implementation that fasten the module and thus fulfill a comparable function for the modular plug system is also possible.

FIG. 2 shows a modular frame 22 of a plug, or at least parts thereof, wherein the modular frame 22 in FIGS. 2a and 2b are to be occupied with modules, namely a master module M, three slave modules S and two standard (i.e. "conventional") modules K. The use of the standard modules K here is of great commercial significance, in particular for the backward compatibility of such a modular plug system.

According to the prior art, the slave modules S would have to be arranged directly one after another and be directly adjacent to the master module M as is suggested, for example, in FIG. 2a, in order to be able to contact one another and thereby also the master module. The conventional modules are therefore necessarily located at the outer end of the modular frame 22 (shown here on the right). This requirement however often leads to problems with an unsuitable occupancy of a mating plug, in particular if this mating plug also comprises slave modules S. These are, after all, typically occupied by the conventional modules K of the plug, and their position is therefore subject to corresponding restrictions of their own modular plug system. In the prior art, it is thus difficult with a known system to use the master module M of the plug also for managing the slave modules S of the mating plug, since these must be located at the respective other end of the modular frame. A distinction of the modules into male (pin contacts) and female (sockets) must also be taken into account here, with the particular requirement that the pin contacts should not normally carry voltage. This means that under some circumstances it is not always possible, for example, to use the slave modules of the mating plug in the modular frame of the plug.

The restrictions related to the occupancy of the individual module slots in the prior art can thus lead to considerable problems and to a considerable additional effort.

On the contrary, it is thus desirable to be able to arrange the modules in any arbitrary sequence in the modular frame.

FIG. 2 shows a modular frame 22 in cross-section, with a view of the inner side of a long side piece 221 into which a circuit board 1 with at least one data bus is integrated. The data thus comprises a conductive track extending in the longitudinal direction over the long side piece 221, namely a conductive data track 14''', particularly well-illustrated in FIG. 3c, for electronic data transmission.

Modules that electrically contact the said conductive data track 14''' can thereby be arranged freely. At the same time, the slave modules S can mutually exchange data with the master module M.

Figure 2C:
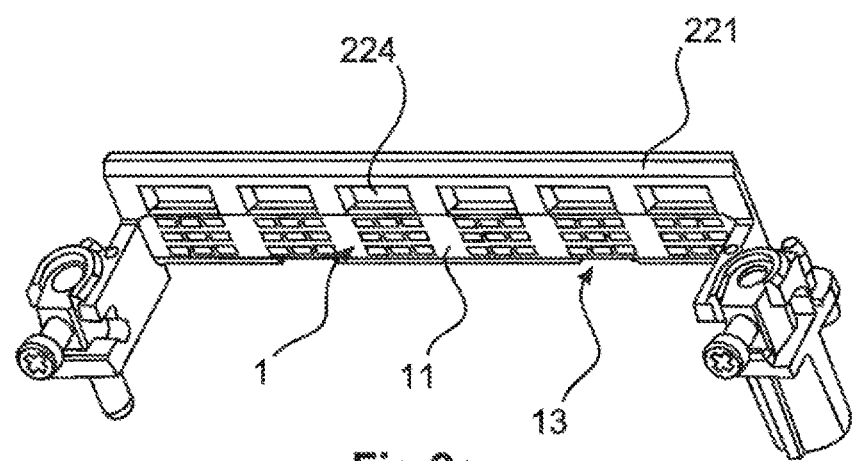
FIG. 2c is a perspective view of a frame portion with integrated circuit board.

FIG. 2c shows a 3D view of a corresponding frame half with the said side piece 221 and the circuit board 1 integrated therein, looking at its front side 11. A set of connecting pads 13 is provided for each module slot on the circuit board 1, and is illustrated in the drawing underneath the window 224 of the side piece 221.

FIG. 3 shows the circuit board 1 with its contact pads 13 and conductive tracks 14.

Figure 3A:
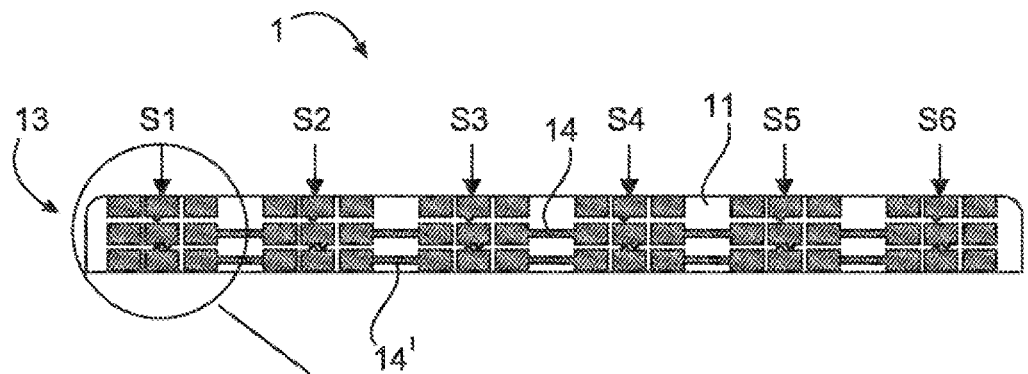
FIGS. 3a, b show a front side and a rear face of a circuit board with conductive tracks and connecting pads.
Figure 3B:
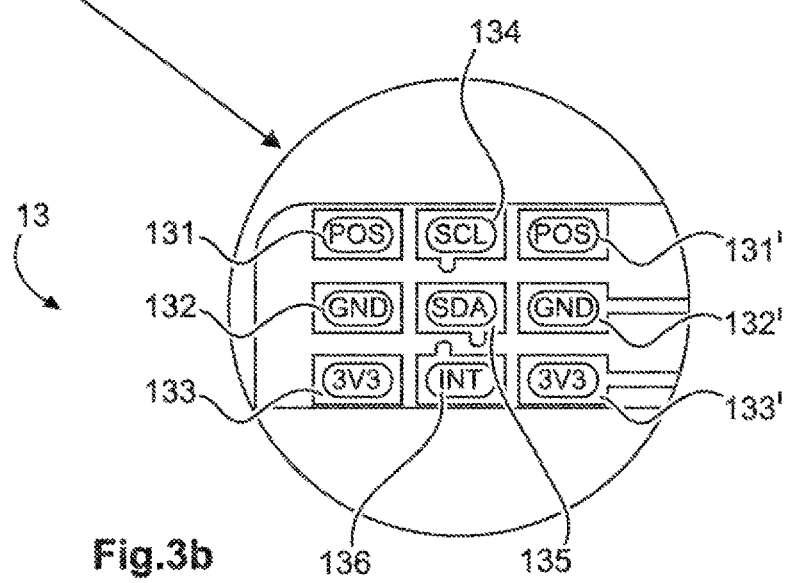
FIG. 3c shows a rear face of a circuit board.

The front side 11 of the circuit board 1 is shown in FIG. 3a, where the various module slots S1, S2, S3, S4, S5, S6, each with an associated set of contact pads 13, are suggested, of which in FIG. 3b a set of connecting pads 13 is labeled comprehensively by way of example as a representative for all the others.

In each case, two position pads 131, 131', two ground pads 132, 132' and two power supply pads 133, 133' are electrically conductively connected to one another by an associated bridge 121, 122 and 123 arranged on the rear face 12 of the circuit board 1. As a result, they are present a plurality of times on the front side of the circuit board 1, and can, for example, be particularly advantageously contacted by reverse-oriented modules, as described below.

The position pads 131, 131' permit the identification of the respective module slot through a resistance encoding described below. The ground pads 132, 132' permit an electrically conductive connection to a defined ground potential for the power supply which, however, can also be used for other applications, e.g. as a reference voltage for a data signal.

Figure 3C:
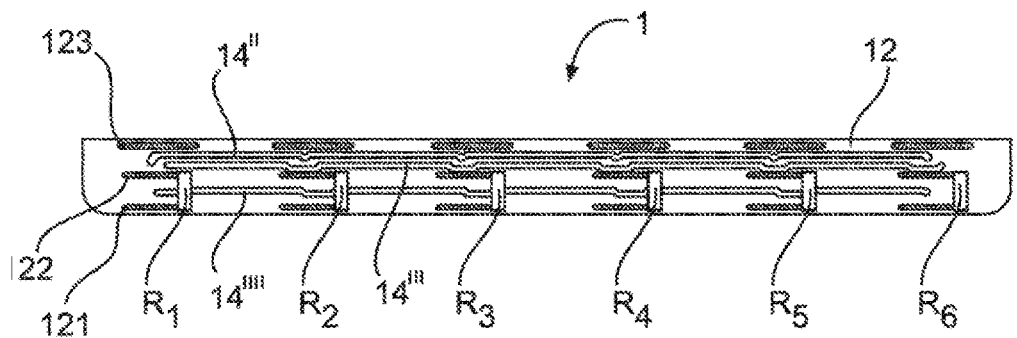

FIG. 3c shows the rear face 12 of the circuit board 1 with the continuous conductive data track 14''' and a conductive clock track 14""' belonging to it, which is provided to transmit a so-called "clock signal" for clocking the data transmission.

In contrast to the two previous illustrations, the circuit board 1 is rotated through 180° about a horizontal axis. As a result, the bridge 121 provided for connecting the position pads 131, 131', is arranged at the bottom of the drawing. The bridge 122 provided for connecting the ground pads 132, 132' is located in the center, and the bridge 123 provided for connecting the power supply pads 133, 133' is located in the region illustrated at the top.

The two further conductive tracks 14, 14' (cf. FIG. 3*a*) provided for power supply are made to be continuous through the two last-mentioned bridges 122, 123. The first further conductive track is a power supply conductive track 14'. The second further conductive track is provided as a ground conductive track 14, and electrically conductively connects the ground pads 132, 132' of the different module slots S1, S2, S3, S4, S5, S6 together.

An interrupt conductive track 14" is provided as an additional continuous conductive track. An electrical resistor R1, R2, R3, R4, R5, R6 is furthermore connected between the resistor pad and the ground bridge at each module slot S1, S2, S3, S4, S5, S6 for the said resistance encoding, wherein these electrical resistors R1, R2, R3, R4, R5, R6 have significantly different magnitudes from one another in order thus to enable an electronic identification of the respective module slot.

Figure 4A:
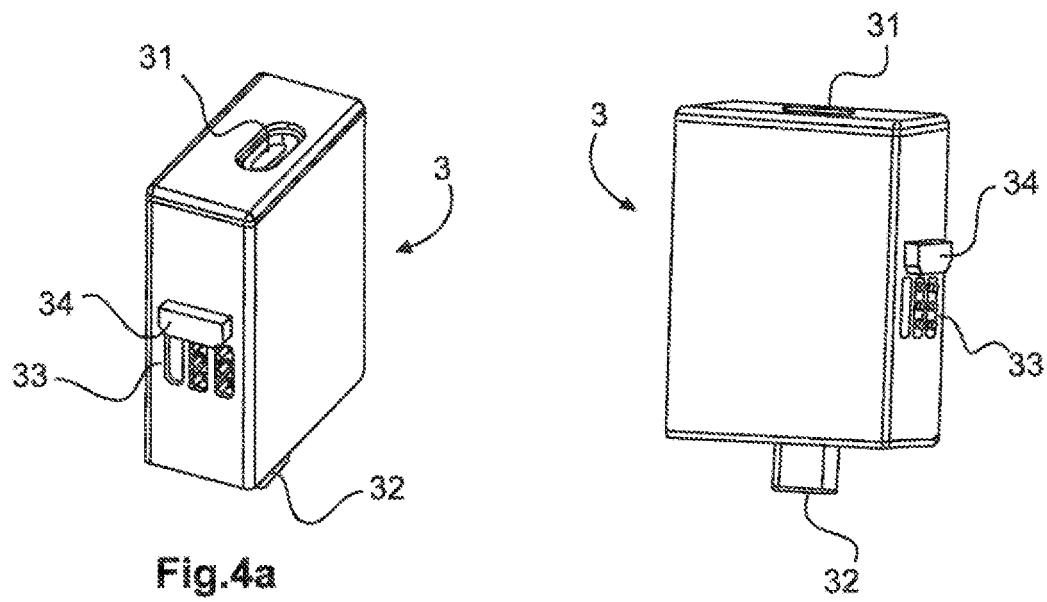
FIG. 4a shows two different views of a master module.

FIG. 4*a* shows two different views of a master module 3. At two mutually opposed end sides, of which only one can be seen in the drawing, the master module 3 has the latching lugs 34, already described. The master module 3 also has a USB socket 31 at the cable connection end, and a USB plug 32 at an opposing plug end. Bus contacts 33 are illustrated at the plug end of the latching lugs, i.e. at the bottom of the drawing. It can be seen here that there are only six bus contacts, of which in each case three are arranged in a row, while the housing, however, provides as standard a further recess for such a row, i.e. a total of three rows.

Figure 4B:
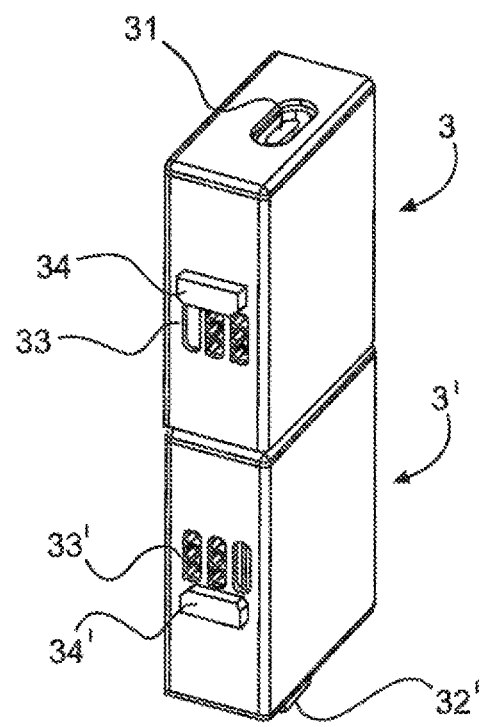
FIG. 4b shows two modules in a reverse orientation.

The purpose of this is so that, if relevant, the same structural form of housing can also be used for the reverse-oriented module illustrated in FIG. 4*b*. This module is the breakout module 3' already explained above. It is easy to see that the master module 3 is inserted with its USB plug 32 into the USB socket of the breakout module 3'. Further slave modules can be cascaded in the same way.

For this purpose, the breakout module must be implemented with a reverse implementation on the plug and connection sides, i.e. the bus contacts 33' are located between the latching lug 33' and the USB socket of the breakout module 3', which is not visible in the drawing. The third, unused row is located next to the two contact rows. This is provided so that, depending on the requirements, the contact row can also be arranged at the other end for specific slave modules in order in this way to be able to design the electronics as nearly identical as possible and as far as possible to use the same electronic components. This is not, however, necessary for the present breakout module 3'.

Figure 5A:
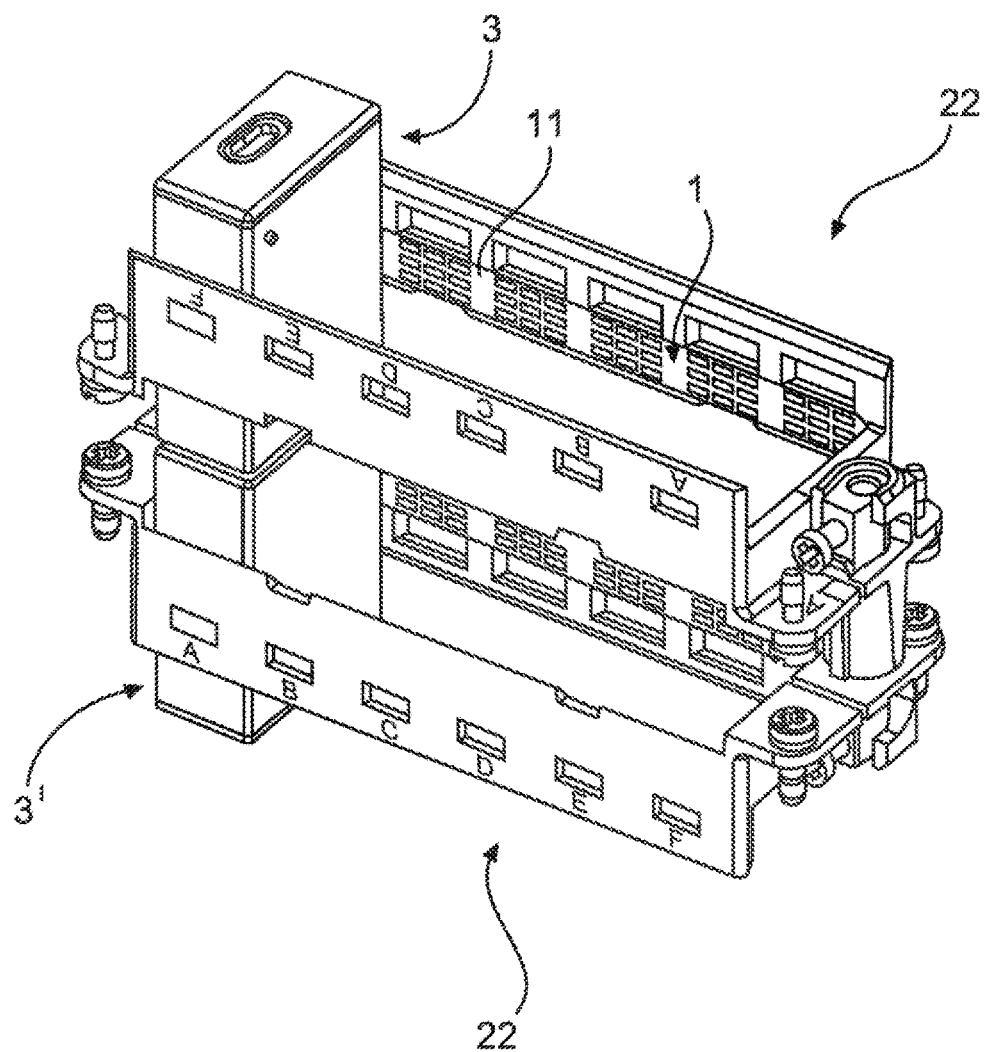
FIGS. 5a, 5b, and 5c show alternative configurations of modules in modular frames.

In FIG. 5*a*, these two master- and modules 3, 3', which are plugged together, are inserted, one in each modular frame 22, while the two modular frames 22 have identical implementation and are joined together.

Considering also the previous illustration (cf. FIG. 4*b*) it can easily be seen that the first row of bus contacts 33, 33' contacts the same pads 131, 132, 133 of the respective bus system. If, as a result of the structural form, the row of contacts shown on the left of the bus contacts 33 of the breakout module 3' is left free, and the contact opening shown on the right is used instead, as is the case with a large number of slave modules, then in each case the other pair of the parallel-connected pairs of pads 131', 132', 133' of the respective bus system is used (cf. FIG. 3*b*). The circuit board 1 is flexible in this respect through the bridging of a plurality of connecting pads. At the same time, the same modular frame 22 can be used regardless, either for the plug or also for the mating plug.

Figure 5B:
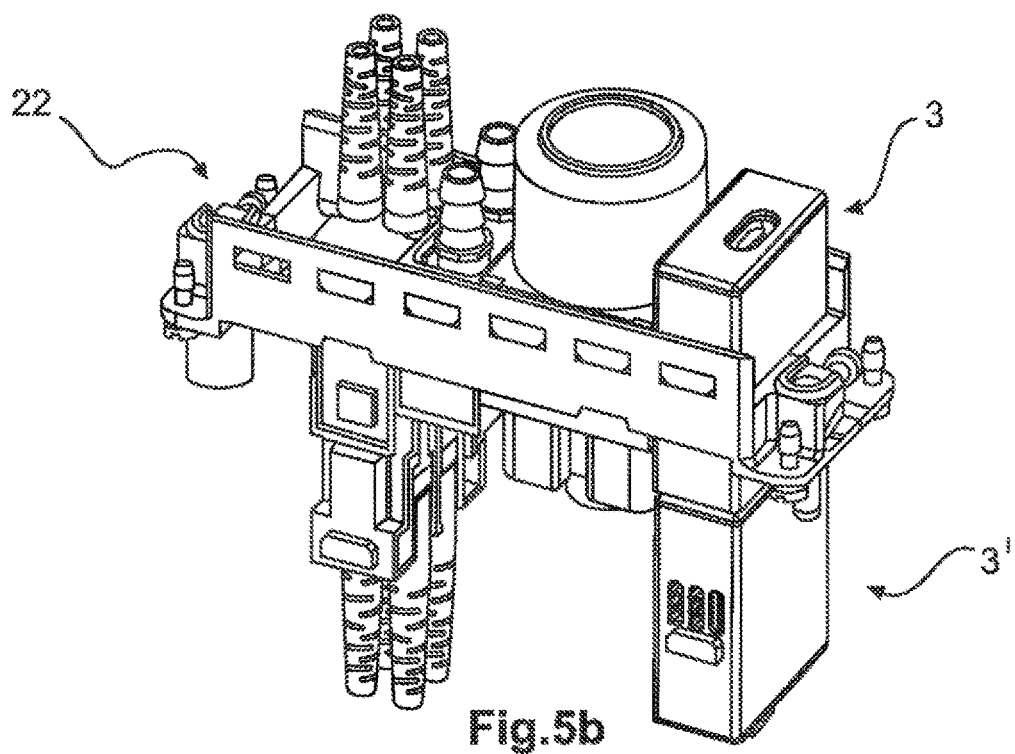
Figure 5C:
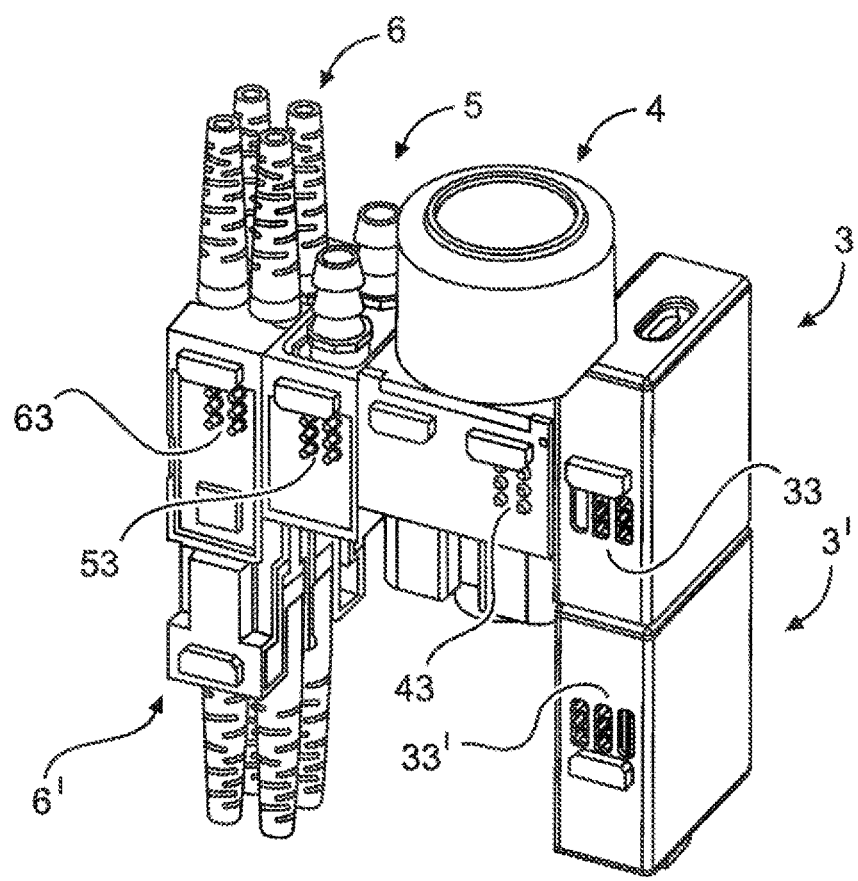

FIGS. 5*b* and 5*c* show an arrangement of a plurality of modules 3, 3', 4, 5, 6, 6' in a modular plug system with and without retaining frames 22.

The following are used as modules here: a master module 3, a breakout module 3' for connecting the master module 3 to the bus system of the modular frame of the mating plug, not shown here, a power module 4 for measuring the transmitted electric power, a pneumatic ("air pressure") module 5 for control measurement of the air pressure transmitted through it and an optical module 6 for measuring scattered light for corresponding fault analysis with a conventional optical counter-module 6' belonging to it.

The slave modules 4, 5, 6 are connected through their bus contacts 43, 53, 63 to the bus system of the circuit board 1, and, in addition, connected in parallel to the bus contacts 33 of the master module 3. The breakout module 3' is connected through its bus contacts 33' to the bus system of the mating plug. The master module 3 receives corresponding data/signals through its USB plug 32' from the breakout module 3' connected to it.

Even though various aspects or features of the invention are respectively shown in combination in the figures, it is clear to the expert—except when otherwise stated—that the combinations illustrated and discussed are not the only possibilities. In particular, units corresponding to one another, or complexes of features from different exemplary embodiments, can be exchanged for one another.

LIST OF REFERENCE SIGNS

1 Circuit board
11 Front side of the circuit board
12 Rear face of the circuit board
121 Bridge for position pads
122 Bridge for ground pads
123 Bridge for power supply pads
13 Set of connecting pads
131, 131' Resistor contact pads
132, 132' Ground pads
133, 133' Power supply pads
134 Clocking pad (clock)
135 Data pad
136 Interrupt pad
14, 14', 14", 14'", 14"" Continuous conductive tracks:
14 Conductive ground track
14' Power supply track
14" Interrupt track
14'" Conductive data track
14"" Clocking track (clock)
S1, S2, . . . , S6 Module slots
R1, R2, . . . , R6 Different electrical resistors
M Master module
Slave module
K Standard ("conventional") module
2 Plug with modular plug system
21 Plug housing
211 Fastening eyes
212 Fastening flange 22 Modular frame, hinged frame
221, 222 Side pieces
223 Hinge
224 Window
225 Fastening ends
226 Fastening screws
23 Plug module
234 Latching lugs of the plug module
A Longitudinal axis
3 Master module
3' Breakout module
31, 31' USB socket
32, 32' USB plug
33, 33' Bus contacts
34, 34' Latching lugs
4 Power module
43 Bus contacts of the power module
5 Compressed air module
53 Bus contacts of the compressed air module
6 Optical fiber module
63 Bus contacts of the optical fiber module

The invention claimed is:

1. A modular plug system, comprising:
a modular frame (22) for a rectangular plug, the modular frame (22) having two long side pieces (221, 222) lying opposite one another;
a bus system with a data bus, comprising at least one conductive track (14''') for electronic data transfer extending over at least one of the two long side pieces;
a master module (3) arranged in the modular frame (22) with at least one electrical bus contact (33) for transmitting queries and for receiving responses over the data bus, the at least one electrical bus contact (33) being arranged on a side of the master module (3) facing one of the two long side pieces (221) and electrically connected to the at least one conductive track (14''); and
a plurality of slave modules (4, 5, 6) arranged in the modular frame (22) each with at least one electrical bus contact (43, 53, 63) for receiving queries from the master module (3) and for transmitting responses to the master module (3), each at least one electrical bus contact (43, 53, 63) being arranged on a side of the respective slave module (4, 5, 6) that faces the one of the two long side pieces (221) and electrically connected to the at least one conductive track (14''),
wherein the master module (3) and the slave modules (4, 5, 6) are electrically conductively connected to one another with their respective at least one bus contact (43, 53, 63) via the at least one conductive track (14''') in the form of a parallel circuit.

2. The modular plug system as claimed in claim 1, wherein the slave modules (4, 5, 6) are connected to the master module (3) over the data bus through a star-point data transfer structure,
wherein the master module (3) constitutes the star point.

3. The modular plug system as claimed in claim 1, wherein the at least one conductive track is at least two conductive tracks (14''', 14''''), including
a first conductive track provided for the electronic data transfer, and
a second conductive track (14'''') provided for clocking ("clock").

4. The modular plug system as claimed in claim 1, wherein the data bus is a master-slave bus.

5. The modular plug system as claimed in claim 1,
wherein the master module (3) has evaluation electronics with control electronics for regulating the electronic data transfer on the data bus in order
to recognize thereby the slave modules (4, 5, 6) held in the modular plug system,
to assign an identification number (ID) to a respective geometric position in the modular frame (22) and, furthermore,
to transmit, assign and accordingly process measured values from sensors arranged in the slave modules (4, 5, 6) to the respective slave module (4, 5, 6).

6. The plug system as claimed in claim 5,
wherein the master module (3) further comprises an external network interface, in order to forward through it at least some of the measured values and/or parameters calculated from them in form of measurement data to an external network.

7. The modular plug system as claimed in claim 1,
wherein the modular plug system further comprises at least two further conductive tracks (14, 14') for supplying power to the slave modules (4, 5, 6) and/or to the master module (3).

8. The modular plug system as claimed in claim 7,
wherein one of the two further conductive tracks (14') is electrically live in operation, and the other conductive track has ground potential (14).

9. The modular plug system as claimed in claim 8,
wherein an electrical resistor (R1, R2, R3, R4, R5, R6) is arranged at an insertion position of each slave module (4, 5, 6) and is connected between a resistor contact pad (131, 131') and the further conductive track (14) that carries ground potential,
wherein these electrical resistors (R1, R2, R3, R4, R5, R6) differ from one another significantly in order to enable an electronic identification of the insertion position of the respective slave module (4, 5, 6).

10. The modular plug system as claimed in claim 1,
wherein the modular plug system comprises at least one additional conductive track (14'') which serves as an interrupt line through which each slave module (4, 5, 6) can indicate presence of a fault state to the master module (3).

11. The modular plug system as claimed in claim 3,
wherein the at least two conductive tracks (14, 14', 14'', 14''', 14'''') are integrated into at least one circuit board (1), and
wherein the at least one circuit board (1) is attached in or at one of the two or both long side pieces (221) within the modular frame (2), and
wherein each of the at least two conductive tracks (14, 14', 14'', 14''', 14'''') for contacting the bus contacts (33, 33', 43, 53, 63) both of the slave modules (4, 5, 6) as well as of the master module (3) comprises at least one contact pad (131, 131', 132, 132', 133, 133', 134, 135, 136) and/or one contacting region.

12. The modular plug system as claimed in claim 11, wherein the circuit board (1) is arranged with positive lock in a recess of the corresponding side piece (221).

13. A method for measuring a parameter in a plurality of slave modules (4, 5, 6) of a modular plug system and for transmitting corresponding measurement data from the slave modules (4, 5, 6) to a master module (3) of the modular plug system, comprising the following steps:
A.) the master module (3) addresses the plurality of slave modules (4, 5, 6) in accordance with a slot position of the respective slave module (4, 5, 6) in a modular frame (22);

B.) the master module (3) requests an identifier from each of the slave modules (4, 5, 6) over a data bus;

C.) the slave modules (4, 5, 6) transmit their respective identifiers over the data bus to the master module (3);

D.) the master module (3) recognizes a type of the respective slave module (4, 5, 6) on the basis of its identifier;

E.) the master module (3) loads in each case a software program from an external source that is appropriate for the type of the slave module (4, 5, 6);

F.) the master module (3) saves the software program in a combined program/data memory;

G.) the master module (3) has the respective software program executed by a microprocessor belonging to the master module (3), in that it transmits individual instructions to the slave modules (4, 5, 6) via the data bus, causing at least one of the slave modules (4, 5, 6) to measure at least one parameter and to make corresponding measurement data available;

H.) the master module (3) requests the measurement data from the respective slave module (4, 5, 6) over the data bus;

I.) the respective slave module (4, 5, 6) transmits the requested measurement data to the master module (3);

J.) the master module (3) saves the measurement data as belonging to the slave module (4, 5, 6) in the combined program/data memory, wherein the plurality of slave modules (4, 5, 6) are arranged at different insertion position with a modular frame, each slave module having bus contacts with which the slave module contacts a data bus of the modular frame, and wherein step A) comprises the following subsidiary steps:

A1) with their bus contacts (43, 53, 63), the slave modules (4, 5, 6) each contact an electrical resistor (R1, R2, R3, R4, R5, R6) arranged at their respective insertion position, wherein the electrical resistors (R1, R2, R3, R4, R5, R6) of the different insertion positions differ from one another significantly;

A2) the respective slave module (4, 5, 6) measures the electrical resistor (R1, R2, R3, R4, R5, R6) arranged at its insertion position;

A3) the master module (3) queries a corresponding measurement value from each slave module (4, 5, 6) over the data bus;

A4) the master module (3) assigns an identification number (ID) to the slave modules (4, 5, 6) corresponding to their respective insertion position;

A5) the master module (3) saves the identification number (ID) as belonging to the respective slave module (4, 5, 6) in its combined program/data memory.

14. A method for measuring a parameter in a plurality of slave modules (4, 5, 6) of a modular plug system and for transmitting corresponding measurement data from the slave modules (4, 5, 6) to a master module (3) of the modular plug system, comprising the following steps:

A.) the master module (3) addresses the plurality of slave modules (4, 5, 6) in accordance with a slot position of the respective slave module (4, 5, 6) in a modular frame (22);

B.) the master module (3) requests an identifier from each of the slave modules (4, 5, 6) over a data bus;

C.) the slave modules (4, 5, 6) transmit their respective identifiers over the data bus to the master module (3);

D.) the master module (3) recognizes a type of the respective slave module (4, 5, 6) on the basis of its identifier;

E.) the master module (3) loads in each case a software program from an external source that is appropriate for the type of the slave module (4, 5, 6);

F.) the master module (3) saves the software program in a combined program/data memory;

G.) the master module (3) has the respective software program executed by a microprocessor belonging to the master module (3), in that it transmits individual instructions to the slave modules (4, 5, 6) via the data bus, causing at least one of the slave modules (4, 5, 6) to measure at least one parameter and to make corresponding measurement data available;

H.) the master module (3) requests the measurement data from the respective slave module (4, 5, 6) over the data bus;

I.) the respective slave module (4, 5, 6) transmits the requested measurement data to the master module (3);

J.) the master module (3) saves the measurement data as belonging to the slave module (4, 5, 6) in the combined program/data memory, wherein the master module (3) controls data traffic on the data bus by a data protocol stored in its combined program/data memory and its microprocessor as follows:

the master module (3) transmits a query via the data bus to one of the slave modules (4, 5, 6) at a time, and recognizably concludes the query;

the queried slave module (4, 5, 6) thereupon transmits a response via the data bus to the master module (3), while all the other slave modules (4, 5, 6) remain silent.

15. A method for measuring a parameter in a plurality of slave modules (4, 5, 6) of a modular plug system and for transmitting corresponding measurement data from the slave modules (4, 5, 6) to a master module (3) of the modular plug system, comprising the following steps:

A.) the master module (3) addresses the plurality of slave modules (4, 5, 6) in accordance with a slot position of the respective slave module (4, 5, 6) in a modular frame (22);

B.) the master module (3) requests an identifier from each of the slave modules (4, 5, 6) over a data bus;

C.) the slave modules (4, 5, 6) transmit their respective identifiers over the data bus to the master module (3);

D.) the master module (3) recognizes a type of the respective slave module (4, 5, 6) on the basis of its identifier;

E.) the master module (3) loads in each case a software program from an external source that is appropriate for the type of the slave module (4, 5, 6);

F.) the master module (3) saves the software program in a combined program/data memory;

G.) the master module (3) has the respective software program executed by a microprocessor belonging to the master module (3), in that it transmits individual instructions to the slave modules (4, 5, 6) via the data bus, causing at least one of the slave modules (4, 5, 6) to measure at least one parameter and to make corresponding measurement data available;

H.) the master module (3) requests the measurement data from the respective slave module (4, 5, 6) over the data bus;

I.) the respective slave module (4, 5, 6) transmits the requested measurement data to the master module (3);

J.) the master module (3) saves the measurement data as belonging to the slave module (4, 5, 6) in the combined program/data memory, wherein the external source is an external network, and wherein the external network communicates with the slave modules (4, 5, 6) as follows:
- the master module (3) receives an external identification number for each slave module (4, 5, 6) from the external network;
- the master module (3) saves the external identification number as belonging to the respective slave module (4, 5, 6) in its combined program/data memory;
- the external network communicates with the software of the respective slave module (4, 5, 6) via the external identification number, wherein
- the master module (3) simulates the external network to the slave module (4, 5, 6), while the physical data exchange takes place between the external network and the master module (3).

16. A method for measuring a parameter in a plurality of slave modules (4, 5, 6) of a modular plug system and for transmitting corresponding measurement data from the slave modules (4, 5, 6) to a master module (3) of the modular plug system, comprising the following steps:
- A.) the master module (3) addresses the plurality of slave modules (4, 5, 6) in accordance with a slot position of the respective slave module (4, 5, 6) in a modular frame (22);
- B.) the master module (3) requests an identifier from each of the slave modules (4, 5, 6) over a data bus;
- C.) the slave modules (4, 5, 6) transmit their respective identifiers over the data bus to the master module (3);
- D.) the master module (3) recognizes a type of the respective slave module (4, 5, 6) on the basis of its identifier;
- E.) the master module (3) loads in each case a software program from an external source that is appropriate for the type of the slave module (4, 5, 6);
- F.) the master module (3) saves the software program in a combined program/data memory;
- G.) the master module (3) has the respective software program executed by a microprocessor belonging to the master module (3), in that it transmits individual instructions to the slave modules (4, 5, 6) via the data bus, causing at least one of the slave modules (4, 5, 6) to measure at least one parameter and to make corresponding measurement data available;
- H.) the master module (3) requests the measurement data from the respective slave module (4, 5, 6) over the data bus;
- I.) the respective slave module (4, 5, 6) transmits the requested measurement data to the master module (3);
- J.) the master module (3) saves the measurement data as belonging to the slave module (4, 5, 6) in the combined program/data memory, wherein the method provides the following steps in the event of the occurrence of a fault state:
- a sensor of a slave module (4, 5, 6) generates a so-called "interrupt" and places associated information into an interrupt service register provided for the purpose;
- the interrupt is transmitted in the form of an electrical alarm signal via an interrupt line provided specifically for this purpose to the master module (3);
- as quickly as possible, the software program being executed at that very time is consequently temporarily interrupted and the master module (3) executes a so-called "interrupt service routine" (ISR) instead;
- in the ISR, the master module (3) queries, via the database, the interrupt service register of all the slave modules (4, 5, 6);
- in this way, the master module (3) finds the faulty slave module (4, 5, 6) and obtains further information about the fault state from the interrupt service register;
- the master module (3) undertakes further steps provided for the respective fault state in accordance with its software program.

17. The modular plug system as claimed in claim 1, wherein the master module (3) comprises a latching lug (34) which engages a corresponding window of the one of the two long side pieces (221), and wherein the at least one electrical bus contact (33) of the master module is arranged adjacent to the latching lug (34).

* * * * *